United States Patent
Schadt et al.

(10) Patent No.: US 9,640,579 B2
(45) Date of Patent: May 2, 2017

(54) OPTOELECTRONIC MODULE COMPRISING A LENS SYSTEM

(75) Inventors: Susanne Schadt, Langenselbold (DE); Michael Peil, Otzberg (DE); Harald Maiweg, Korschenbroich (DE); Florin Oswald, Frankfurt (DE); Marcus Krauel, Hamburg (DE)

(73) Assignee: HERAEUS NOBLELIGHT GMBH, Hanau (DE)

( * ) Notice: Subject to any disclaimer, the term of this patent is extended or adjusted under 35 U.S.C. 154(b) by 165 days.

(21) Appl. No.: 14/232,298

(22) PCT Filed: Jul. 6, 2012

(86) PCT No.: PCT/EP2012/002838
§ 371 (c)(1),
(2), (4) Date: Apr. 3, 2014

(87) PCT Pub. No.: WO2013/010636
PCT Pub. Date: Jan. 24, 2013

(65) Prior Publication Data
US 2014/0339440 A1 Nov. 20, 2014

(30) Foreign Application Priority Data
Jul. 18, 2011 (DE) .......................... 10 2011 107 895

(51) Int. Cl.
*F21S 8/00* (2006.01)
*H01L 27/146* (2006.01)
(Continued)

(52) U.S. Cl.
CPC .... *H01L 27/14627* (2013.01); *G02B 13/0085* (2013.01); *G02B 19/0014* (2013.01);
(Continued)

(58) Field of Classification Search
CPC .... F21V 5/004; F21V 5/007; F21Y 2105/001; G02B 13/0085; G02B 3/0006;
(Continued)

(56) References Cited

U.S. PATENT DOCUMENTS 5,466,926 A * 11/1995 Sasano ................. G02B 3/0018
250/216
5,806,969 A * 9/1998 Rosengren ................ F21V 5/02
362/235
(Continued)

FOREIGN PATENT DOCUMENTS

DE 60123122 T2 9/2007
DE 102010044470 A1 3/2012
(Continued)

OTHER PUBLICATIONS

German translation of an Office Action issued Feb. 9, 2015 in JP Application No. 2014-520557.
(Continued)

*Primary Examiner* — Andrew Coughlin
*Assistant Examiner* — Alexander Garlen
(74) *Attorney, Agent, or Firm* — Panitch Schwarze Belisario & Nadel LLP

(57) ABSTRACT

The invention relates to an optoelectronic module, more particularly to an optoelectronic chip-on-board module. The optoelectronic module comprises a substrate, wherein the substrate has a planar design. Furthermore, the optoelectronic module comprises a plurality of optoelectronic components that are arranged on the substrate. Furthermore, the optoelectronic module comprises a lens system having a plurality of lenses. The lens system comprises at least two lenses with different directivities.

13 Claims, 6 Drawing Sheets

(51) Int. Cl.
*H01L 25/075* (2006.01)
*H01L 33/58* (2010.01)
*G02B 19/00* (2006.01)
*G02B 13/00* (2006.01)
*H01L 27/15* (2006.01)
*H01L 33/54* (2010.01)

(52) U.S. Cl.
CPC ...... *G02B 19/0066* (2013.01); *H01L 25/0753* (2013.01); *H01L 27/156* (2013.01); *H01L 33/58* (2013.01); *H01L 33/54* (2013.01); *H01L 2924/0002* (2013.01); *Y02E 10/52* (2013.01)

(58) Field of Classification Search
CPC .... G02B 3/0037; G02B 3/0043; G02B 3/005; G02B 19/0066; H01L 25/0753; H01L 33/58; H01L 27/14627; H01L 27/156
See application file for complete search history.

(56) References Cited

U.S. PATENT DOCUMENTS

| | | | |
|---|---|---|---|
| 7,221,864 B2* | 5/2007 | Seo | G03B 15/06 348/371 |
| 7,284,871 B2 | 10/2007 | Oon et al. | |
| 7,819,550 B2 | 10/2010 | Anderson et al. | |
| 2003/0011888 A1 | 1/2003 | Cox et al. | |
| 2003/0053310 A1 | 3/2003 | Sommers | |
| 2006/0023314 A1* | 2/2006 | Boettiger | G02B 3/0018 359/621 |
| 2006/0138437 A1 | 6/2006 | Huang et al. | |
| 2007/0030675 A1 | 2/2007 | Oon et al. | |
| 2007/0045761 A1 | 3/2007 | Basin et al. | |
| 2010/0065983 A1 | 3/2010 | Kawakubo | |
| 2010/0321640 A1 | 12/2010 | Yeh et al. | |
| 2011/0007513 A1 | 1/2011 | Zhang et al. | |
| 2012/0001208 A1* | 1/2012 | Brick | H01L 25/0753 257/89 |
| 2013/0154130 A1 | 6/2013 | Peil et al. | |

FOREIGN PATENT DOCUMENTS

| | | |
|---|---|---|
| DE | 102010044471 A1 | 3/2012 |
| JP | H02-94673 A | 4/1990 |
| JP | H07-211943 A | 8/1995 |
| JP | 2007-027325 A | 2/2007 |
| JP | 2007-080526 A | 3/2007 |
| JP | 2007-207956 A | 8/2007 |
| JP | 2010-192347 A | 9/2010 |
| WO | 2010108761 A1 | 9/2010 |

OTHER PUBLICATIONS

Office Action issued Mar. 11, 2015 in KR Application No. 10-2014-7003970.

Int'l Search Report issued Dec. 11, 2012 in Int'l Application No. PCT/EP2012/002838.

Office Action issued Mar. 19, 2012 in DE Application No. 10 2011 107 895.2.

English translation of Office Action issued Feb. 3, 2016 in CN Application No. 201280035543.6.

Office Action issued May 1, 2016 in KR Applicaiton No. 10-2016-7004528.

Office Action issued Sep. 20, 2016 in CN Application No. 201280035543.6.

* cited by examiner

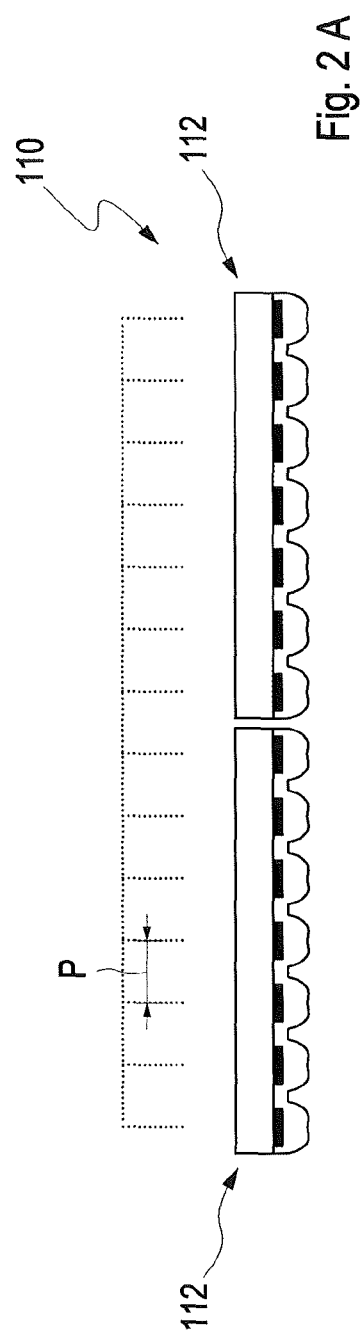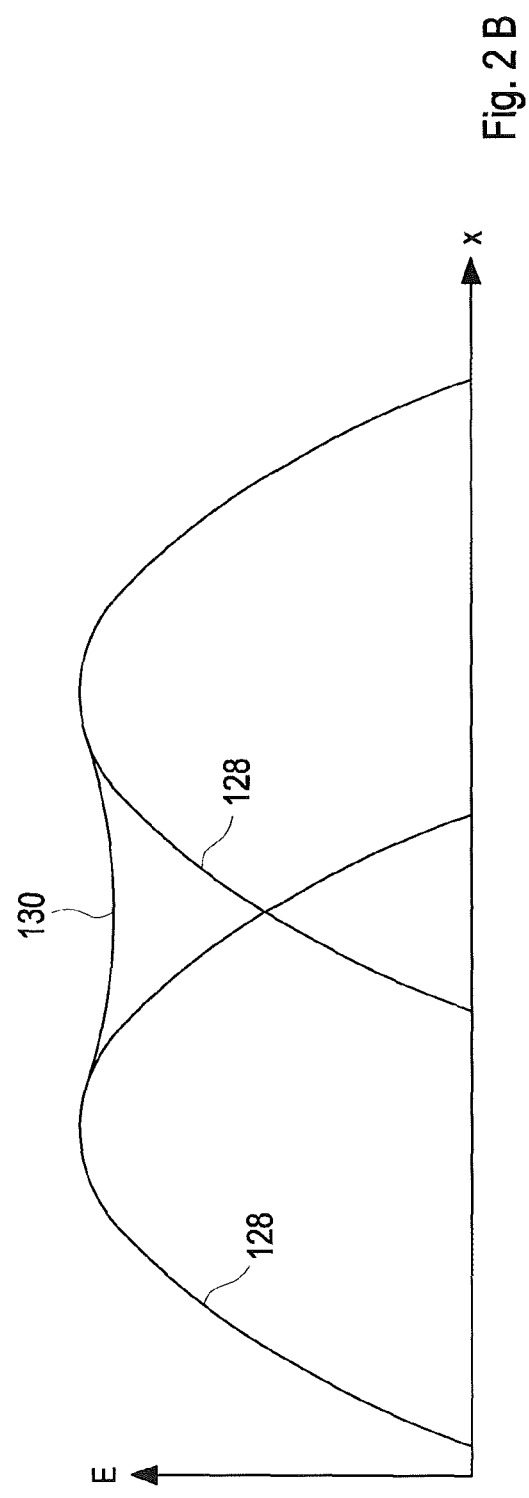

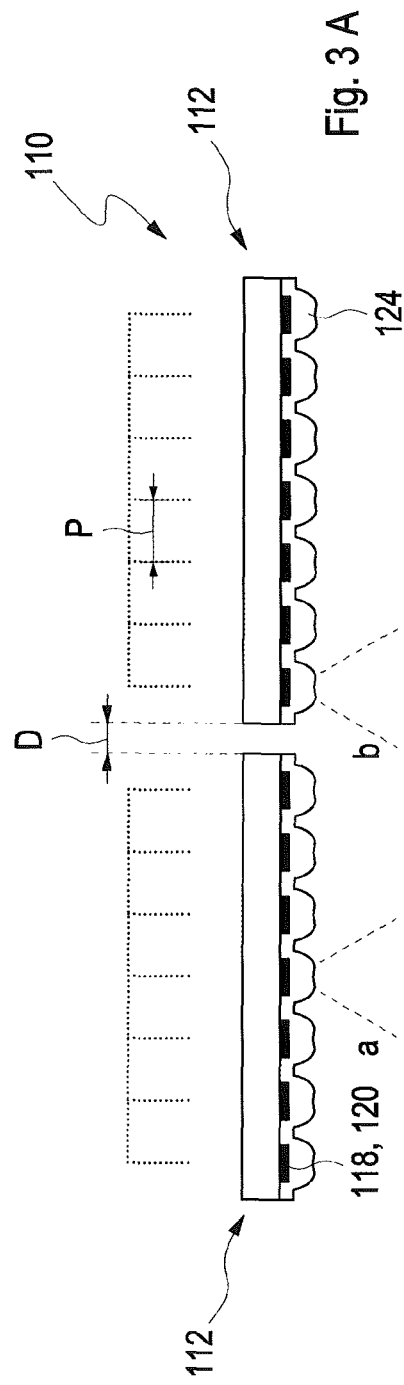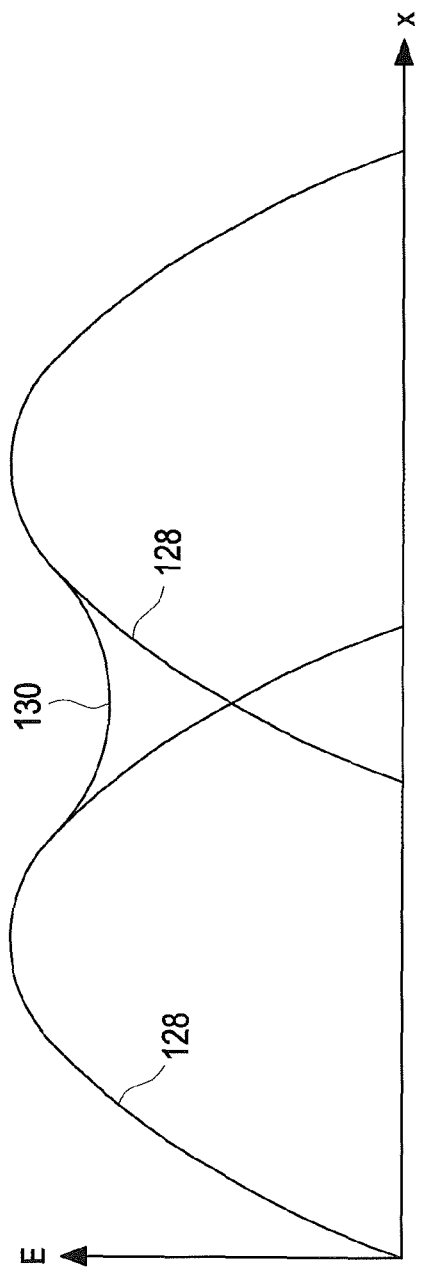

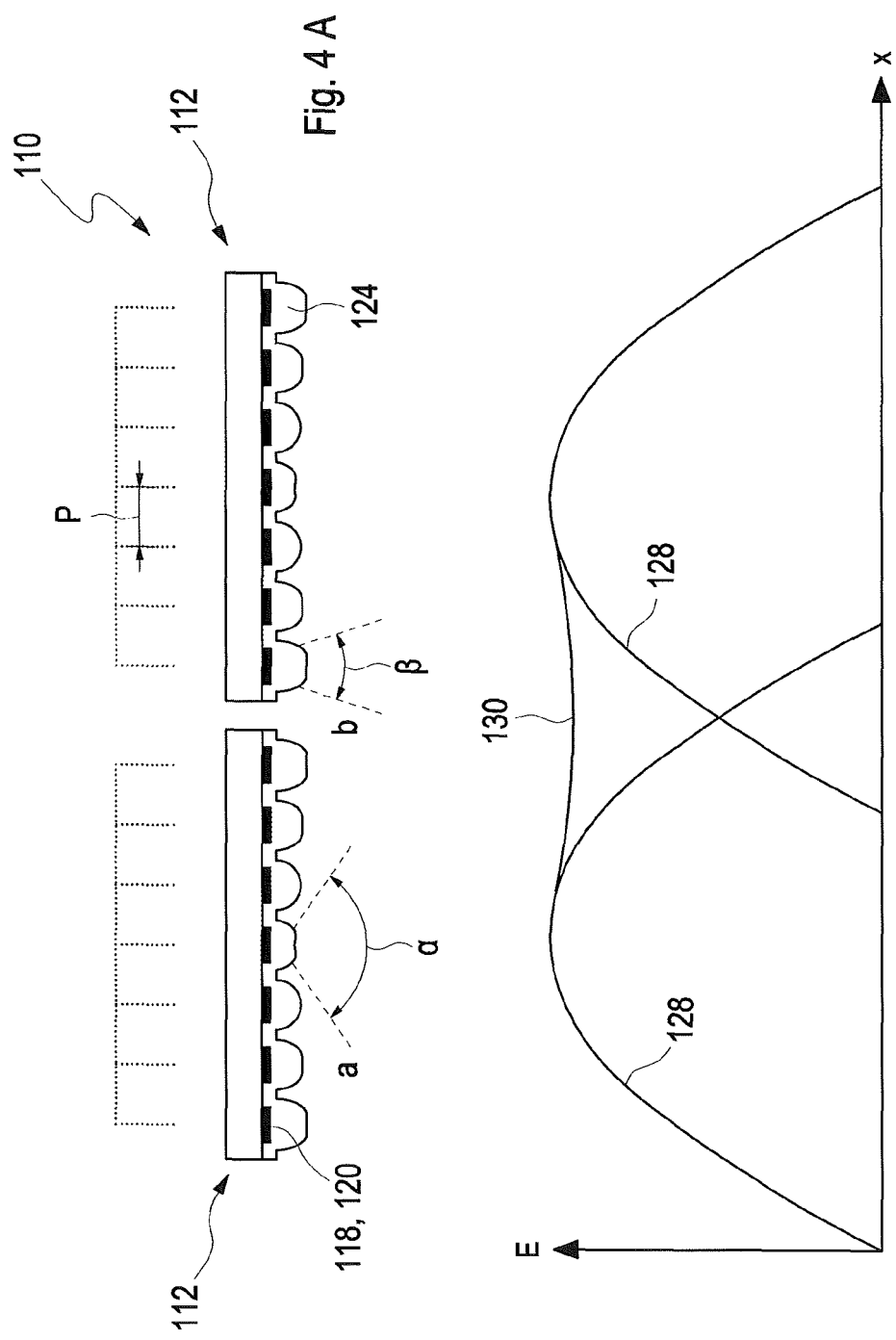

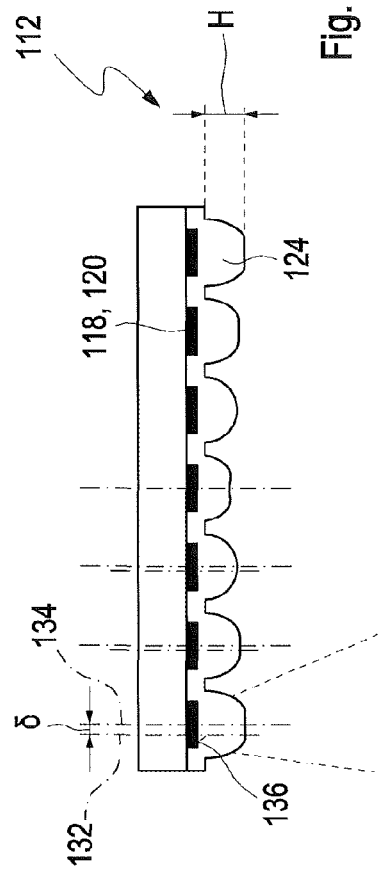
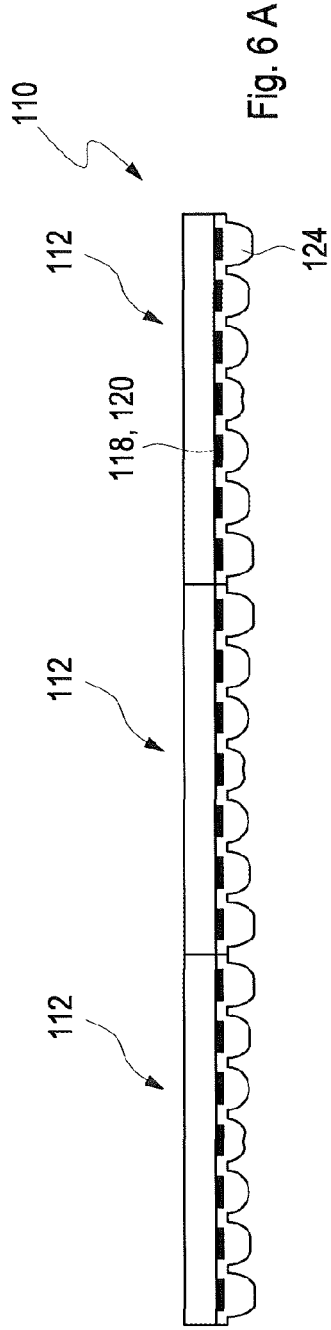
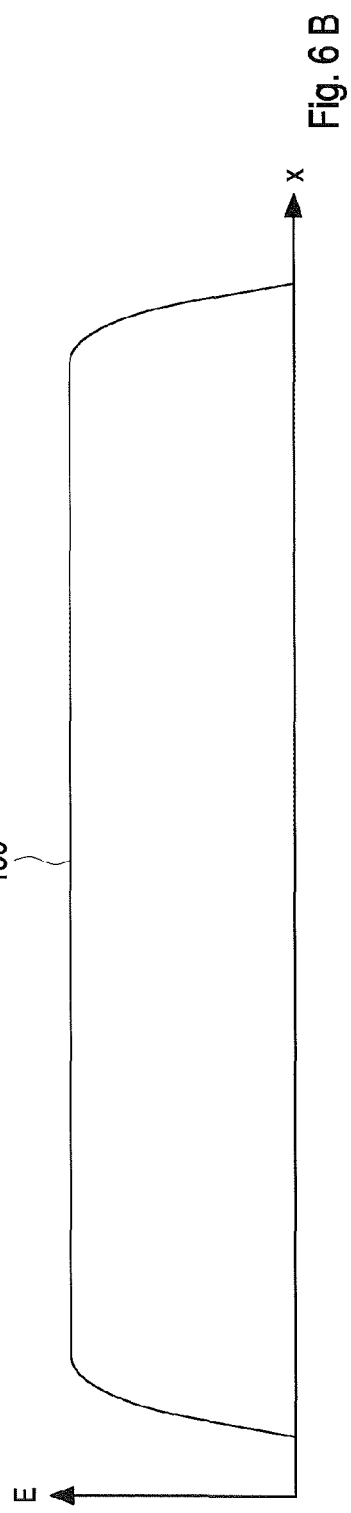

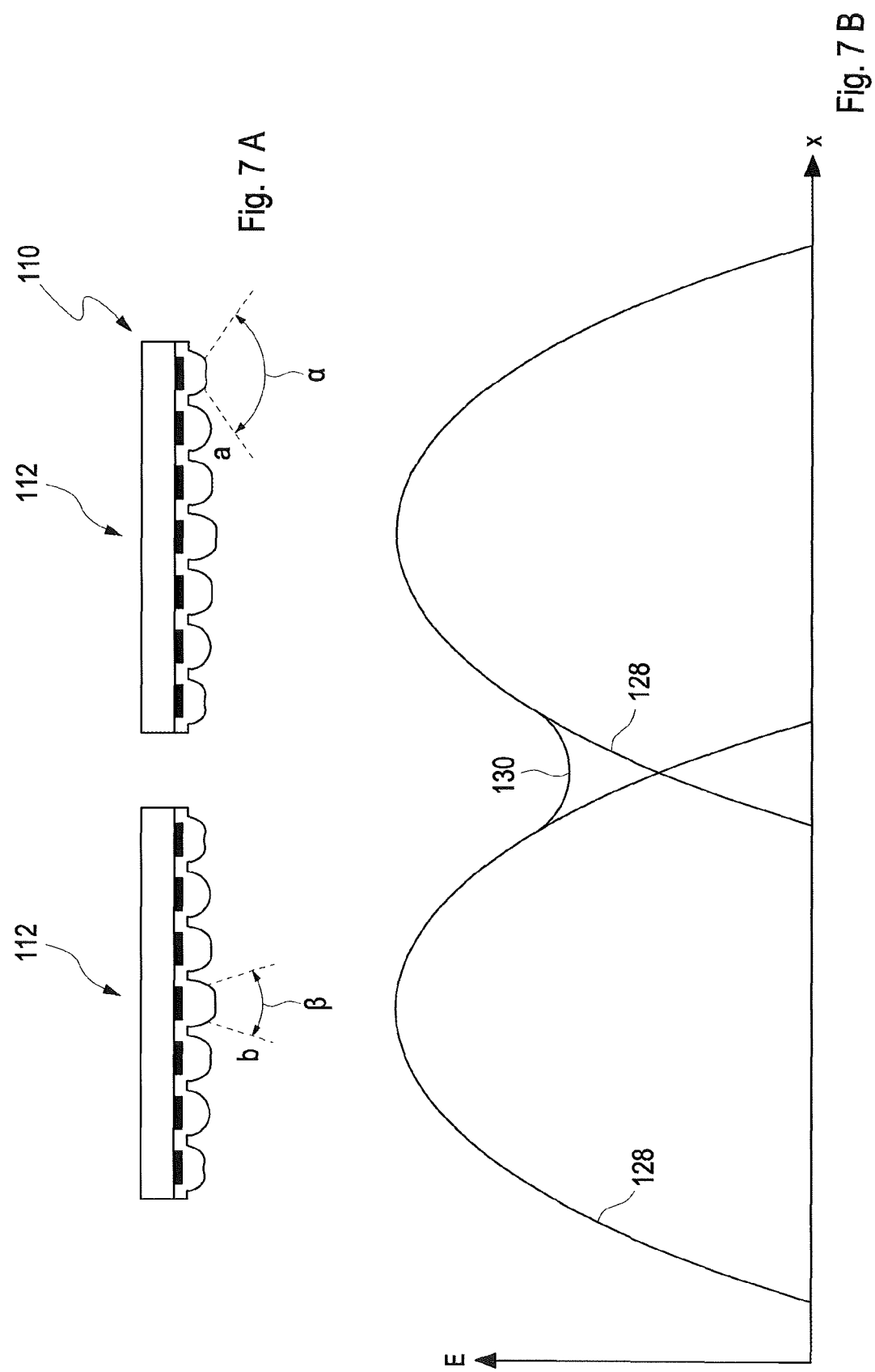

OPTOELECTRONIC MODULE COMPRISING A LENS SYSTEM

CROSS-REFERENCE TO RELATED APPLICATIONS

This application is a Section 371 of International Application No. PCT/EP2012/002838, filed Jul. 6, 2012, which was published in the German language on Jan. 24, 2013, under International Publication No. WO 2013/010636 A1 and the disclosure of which is incorporated herein by reference.

BACKGROUND OF THE INVENTION

The invention relates to an optoelectronic module, an optoelectronic device, a method for manufacturing an optoelectronic module, as well as a use of an optoelectronic module. Such optoelectronic modules, optoelectronic devices, methods and uses can be employed in natural sciences, technology, medicine and daily life in various manners. An important field of application to which the invention, however, is not limited, is its use in the field of process technology, for example, for the purpose of drying and/or hardening materials and/or objects or for the purpose of a photochemical modification of workpieces. As an alternative or in addition, optoelectronic modules and optoelectronic devices of the type described below can, for example, also be used in the field of illumination, for example, in traffic engineering and/or in building services.

In particular, the invention relates to optoelectronic modules which are designed as what are called chip-on-board modules, either as a whole or in part. Such chip-on-board modules are modules which can be manufactured according to what is called chip-on-board technology (CoB), either as a whole or in part. According to chip-on-board technology, one or more unhoused semiconductor components (semiconductor chips) are directly mounted to a substrate, for example, a printed circuit board or another type of interconnect devices. In general, the term of chip-on-board module therefore relates to an electronic assembly which includes at least one substrate as well as at least one unhoused (naked) semiconductor component mounted to a substrate. For example, such chip-on-board modules are used as luminous elements, as high-performance lamps (for example, as high-performance UV LED lamps), as photovoltaic modules, as sensors, or in any other manner. In particular, the optoelectronic modules suggested are optoelectronic chip-on-board modules having a plurality of optoelectronic components. Within the scope of the present invention, the optoelectronic components used therein may, for example, however not exclusively, be light-emitting diodes (LEDs) and/or photodiodes, particularly in the form of chips or other components, which are arranged in the chip-on-board module on a planar substrate, more particularly a substrate made of metal, ceramic or silicon, a metal-core or FR4 printed circuit board, a glass substrate, a plastic substrate, a metal matrix compound material, or similar substrates. These chip-on-board modules must be protected against mechanical damage and corrosion. To achieve this, it is tried to find solutions that are as compact and simple as possible.

Since, usually, protection in the form of housings on chip-on-board modules is complex in terms of costs and technology, planar potting of all or a plurality of components with a plastic-based potting material is known as practical prior-art alternative for protecting such chip-on-board modules. Along with other functional components, such as solder tracks and contacting elements, the optoelectronic components in chip-on-board modules, together with a planar substrate, can be protected against mechanical damage and corrosion by means of coatings.

Furthermore, a directivity of the optoelectronic modules plays an important role for many applications. For optoelectronic components, directivity generally describes an angular dependence of the strength of waves received or transmitted, which is usually related to a sensitivity and/or intensity in a main direction, i.e., along an optical axis of the optoelectronic components. In particular, a radiation intensity and/or a directional characteristic of the optoelectronic module usually play an important role in optoelectronic modules which comprise one or more light-emitting diodes as optoelectronic components. This directional characteristic is a special from of the directivity and, in this case, describes the angular dependence of the electromagnetic field and/or the intensity of the electromagnetic waves emitted, more particularly in the form of infrared, ultraviolet or visible light. Chip-on-board modules are to advantage in that light-emitting diodes can be applied onto the substrate with a high packaging density, this increasing the radiation intensity. In many cases, however, an additional optical system is used to affect the directional characteristic of the optoelectronic modules. For light-emitting optoelectronic modules as well as for photosensitive optoelectronic modules, this optical system can, for example, be lens systems comprising one or more lenses, more particularly what are called microlens systems. For example, the lens systems, more particularly the microlens systems, can comprise one or more beam-forming elements the lateral extension of which, for example the extension of which in a plane of the substrate, may range from the sub-millimeter range to the decimeter range or even to the meter range. For example, the microlens systems can be designed such that these optically active ranges comprise structures in the sub-millimeter range, for example, structures having a diffracting, scattering, converging, collimating or diffusing effect.

Due to the fact that the distances required between the optoelectronic components are usually short, more particularly due to the short pitch (centre-to-centre distance between neighboring optoelectronic components) typically used in chip-on-board modules, there are only a few known methods allowing the implementation of beam-forming microlenses above the individual optoelectronic components, for example, the individual light-emitting diodes of an array of light-emitting diodes, for example by means of an appropriate potting material.

For example, the post-published document, DE 10 2010 044 470, from the house of the Applicant of the present application describes a method for coating an optoelectronic chip-on-board module which comprises a planar substrate fitted with one or more optoelectronic components. Therein, use is made of a transparent UV- and temperature-resistant coating consisting of one or more silicones. According to the method, the substrate to be coated is pre-heated to a first temperature. Furthermore, a bank is applied which encloses an area or partial area to be coated of the substrate. This bank, as a whole or in part, is composed of a first thermally hardening, highly reactive silicone which hardens at a first temperature. This first silicone is applied to the pre-heated substrate. Furthermore, the area or partial area of the substrate that is enclosed by the bank is filled with a liquid second silicone, and the second silicone is hardened. Therein, it is also possible to apply quickly hardening lenses onto individual components of the substrate, particularly by means of the first silicone. In this manner, it is also possible to form microlens systems.

Furthermore, a coating method for an optoelectronic chip-on-board module is known from the likewise post-published document, DE 10 2010 044 471, that is also originating from the house of the Applicant of the present application. Again, the optoelectronic chip-on-board module comprises a planar substrate which is fitted with one or more optoelectronic components and includes a transparent UV- and temperature-resistant coating consisting of silicone. The method comprises a method step of potting a liquid silicone into a mould that is open at the top and comprises outside dimensions that correspond to the outside dimensions of the substrate or are in excess thereof. Furthermore, the substrate is introduced into the mould wherein the optoelectronic component or the optoelectronic components completely immerse(s) into the silicone. In a further method step, the silicone is hardened and cross-linked with the optoelectronic components and the substrate. Furthermore, the substrate provided with the coating consisting of the hardened silicone is removed from the mould.

Furthermore, an LED array which comprises a lens array for converging divergent light from each LED is known from U.S. Pat. No. 7,819,550 B2. The lenses each comprise a flat section and two curved sections. The lenses are not curved above the light-emitting diodes.

A method for manufacturing a white-light LED is known from US 2007/0045761 A1. Therein, use is made of an LED which emits blue light and use is made of phosphoruses which convert the light. Among other things, said document also describes the molding of optical systems above the light-emitting diodes, which are produced by means of a casting process that is sealing against the atmosphere.

Furthermore, a method for encapsulating light-emitting diodes by means of a compressing casting method is known from US 2010/0065983 A1. Therein, use is made of a tape for sealing during the casting process.

Despite the improvements described above and achieved for known optoelectronic modules, there is still a demand for optoelectronic modules with improved directivity, more particularly a demand for optoelectronic modules with a high radiation intensity for specific applications. In particular, there is a demand for efficient light sources that can be mounted side by side and the lighting profile of which may have a high radiation intensity at an adjustable distance, wherein high homogeneity requirements are met at the same time and a sufficiently steep drop can be registered in the edge region. Such optoelectronic modules, more particularly modules of light-emitting diodes, are required for lithographic applications in the industrial production of the printing industry in order to reach a uniform and high-quality drying image of print colors and inks High radiation intensities, for example, generally radiation intensities of more than 100 mW/cm$^2$, typically 1-20 W/cm$^2$, up to a few 100 W/cm$^2$, are usually required for reaching high process velocities with light sources that are as compact and energy-efficient as possible.

BRIEF SUMMARY OF THE INVENTION

It is therefore the object of the present invention to provide an optoelectronic module which obviates the drawbacks of known methods at least to a large extent and which meets the aforementioned requirements at least to a large extent. In particular, it is the object of the present invention to provide an optoelectronic module which, when configured as a light-emitting module, comprises a high efficiency and radiation intensity, which can be used as a side-by-side-mounting light source, and which comprises a lighting profile having a high homogeneity and a sufficiently steep drop in an edge region.

This problem is solved by an optoelectronic module, an optoelectronic device, a method, and a use with the features of the independent claims. Advantageous refinements of the invention, which can be implemented alone or in combination, are presented in the dependent claims.

An optoelectronic module is suggested according to a first aspect of the present invention. In general, an optoelectronic module is to be understood as an assembly which can be handled as a unit and which comprises at least one optoelectronic component, for example, a light-emitting electronic component and/or a light-sensitive electronic component. The optoelectronic module can, in particular, be designed as an optoelectronic chip-on-board module according to the definition mentioned above.

The optoelectronic module comprises a substrate that has a planar design. Within the general scope of the present invention, a substrate is to be understood as an element that is established to receive one or more electronic, more particularly one or more optoelectronic, components. In particular, the substrate can be designed according to the type described above with regard to the state of the art and can comprise one or more interconnect devices, more particularly according to the type mentioned. A planar design is to be understood as a design in which at least one surface that can be fitted with the optoelectronic component, more particularly an unhoused chip, for example a flat or a slightly curved surface onto which one or more optoelectronic components, more particularly one or more optoelectronic chips without housing, can be applied. For example, the planar substrate can be designed flat as a whole or in part, for example, as a printed circuit board.

Furthermore, the optoelectronic module comprises a plurality of optoelectronic components that are arranged on the substrate. In particular, these optoelectronic components can be arranged on the substrate in chip-on-board technology. Optoelectronic components, as described above, are to be understood as components which fulfill at least one optoelectronic function, for example, a light-emitting and/or light-sensitive function. In particular, the optoelectronic components can be selected from the group consisting of light-emitting diodes and photodiodes. The optoelectronic components can, in particular, comprise one or more unhoused chips. Accordingly, the plurality of optoelectronic components can, in particular, comprise an array of optoelectronic components, i.e., an arrangement in which a plurality of optoelectronic components are applied onto the substrate in one or more rows. For example, the array can comprise a rectangular matrix with at least one row and/or at least one column or with a plurality of rows and columns. Therein, a row and/or column is to be understood as a linear arrangement of at least two, preferably at least three, four or more optoelectronic components. That means that the plurality of optoelectronic components can, preferably, comprise a rectangular matrix of light-emitting diodes and/or photodiodes. As a matter of principle, however, other embodiments are also possible, for example, embodiments in which the plurality of optoelectronic components is irregularly arranged on the substrate and/or is arranged on the substrate in a non-rectangular matrix.

Furthermore, the optoelectronic module comprises a lens system, more particularly a microlens system, having a plurality of lenses, more particularly microlenses. Therein, a lens is generally to be understood as an optical element which is able to form electromagnetic beams wherein the electromagnetic beams are diffracted at least once. Therein, lenses, for example microlenses, can comprise lateral dimensions from the sub-millimeter range to the meter range. For example, lamp systems for industrial applications can comprise lateral extensions, for example lengths, of up to 3 m or more. In particular, the lenses can comprise converging and/or scattering properties. A lens system, more particularly a microlens system, is to be understood as a plurality of lenses, more particularly microlenses, which are preferably arranged next to each other, for example in a plane parallel to a plane of the planar substrate. For example, the lens system can comprise an array of lenses, wherein a plurality of lenses is arranged in one or more rows and/or one or more columns. For example, the lens array can, in turn, comprise a rectangular array. As will be explained in more detail below, one lens can, for example, each be assigned to exactly one optoelectronic component or a group of a plurality of optoelectronic components, with the result that the lens system can, for example, be arranged in an array that can correspond to the array of the optoelectronic components. In particular, the lens system can, as a whole or in part, be made of a continuously designed optically transparent material that forms a plurality or all of the lenses of the lens system. This optically transparent material, for example a plastic material, can particularly be directly applied onto the optoelectronic components, for example in a casting process. For example, the lens system can generally comprise an optically transparent material that is in contact with the optoelectronic components and that forms the plurality of lenses or at least a plurality of lenses of the lens system.

The lens system comprises at least two lenses, for example at least two microlenses having a different directivity. As has been mentioned above, directivity is, therein, to be understood within the general scope of the present invention as an angular dependence of received or transmitted electromagnetic waves, more particularly light in the visible and/or infrared and/or ultraviolet spectral range. For example, this angular dependence can refer to the electromagnetic field of the electromagnetic waves. As an alternative or in addition, the angular dependence can, for example, also refer to an intensity and/or an energy density and/or another physical variable characterizing the strength of the electromagnetic waves. For example, the directivity can be specified with reference to a strength in a main direction which is, for example, parallel to an optical axis of the optoelectronic component, for example an axis which drives through a sensitive and/or emitting active surface of the optoelectronic component in a vertical and centric manner. In particular, the directivity can comprise a directional characteristic if the optoelectronic module comprises one or more optoelectronic components in the form of light-emitting components, for example light-emitting diodes. For example, the directional characteristic can be measured by means of an appropriate sensor which is arranged at a variable angle and at a predetermined distance in front of the optoelectronic component, wherein continuous or discontinuous measurements of a strength of an emission, for example, measurements of an intensity, are taken at different angles. In this manner, it is, for example, possible to register directivities by means of appropriate polar diagrams of the measurements. Such measuring methods are known to persons skilled in the art from the field of lighting technology. As a matter of principle, the precise embodiment of the method used is, therein, of no importance for the present invention because nothing but a comparison of the directivities of the lenses is made.

The directivity of a lens can, in particular, be understood as the directivity of a lens in cooperation with an optoelectronic component, for example a light-emitting diode, that is assigned to the lens. As has been described above, the lenses can, in particular, each be assigned to one optoelectronic component of the plurality of optoelectronic components, with the result that, for example, exactly one lens of the lens system is arranged above each optoelectronic component. Accordingly, a directivity of the lens is then to be understood as the directivity of the group that is composed of the optoelectronic component as well as the lens arranged above that optoelectronic component.

The directivities of the at least two lenses can differ from each other, for example, with regard to an opening angle, for example with regard to an emission angle. For example, an emission angle can be understood as an angle which is enclosed by the lateral points with half of the maximum light intensity. It is, however, also possible to use other characteristics of the directivity for comparing the directivities.

For example, the at least two lenses the directivities of which differ from each other can be arranged in an interior region of the lens system, for example of the lens array, and at an edge of the lens system, for example of the lens array. For example, the lens system can comprise a lens array in the form of a one-dimensional or a two-dimensional matrix of lenses. For example, lenses that are arranged at an edge of the lens array can, therein, comprise a different directivity than lenses that are arranged in the interior region of the lens array. In the case of a linear matrix, this edge can, for example, each consist of the outermost lenses. In the case of a two-dimensional matrix, the edge can comprise a line or a frame of lenses which are arranged at the edge of the lens system. These edges can differ from at least one lens which is arranged in the interior region of the lens system, i.e. aside the edge, with regard to their directivities. Therein, the lenses of the lens system can be designed such that at least two groups of lenses are provided, wherein the lenses of at least one first group comprise a first directivity and wherein the lenses of the at least one second group comprise at least one second directivity, wherein the first directivity and the second directivity differ from each other. Therein, the lens system can comprise a stepwise change in the directivities, with the result that, for example, the directivities continuously or discontinuously change from an interior region of the lens system towards an edge of the lens system. Therein, two or more steps of the change can be provided.

As has been mentioned above, the optoelectronic components can be arranged on a substrate in a one-dimensional or two-dimensional array, i.e. in a one-dimensional or two-dimensional matrix. In particular, this array can comprise a line or a two-dimensional matrix wherein, in a two-dimensional matrix, at least two optoelectronic components are arranged in each of two dimensions. In particular, the one-dimensional or two-dimensional array can comprise a number of at least 2, at least 4, at least 8, at least 10, at least 50, or even at least 100 of optoelectronic components. Therein, an even number of optoelectronic components or an uneven number of optoelectronic components is conceivable because it is, for example, even possible to implement arrangements in an array that deviate from rectangular grid arrangements, for example hexagonal arrangements of the optoelectronic components in the array, for example hexagonal LED arrays.

As has been mentioned above, the optoelectronic components can, in particular, be selected from the group consisting of light-emitting diodes, more particularly surface-emitting light-emitting diodes, and photodiodes.

The at least two lenses with different directivities can, in particular, comprise lenses with a different surface curvature. Therein, a surface curvature is generally to be understood as a design of the surface in one or more cutting planes through the lens, for example a cutting plane which extends through an optical axis of the optoelectronic component and/or the lens, which is also referred to as main direction. The lenses can be designed such that they are rotationally symmetrical around this optical axis or they can also be designed asymmetrically. A convex curvature can, for example, describe an area having a converging effect, and a concave curvature can, for example, describe an area having a scattering effect.

As an alternative or in addition to lenses with different surface curvatures, the at least two lenses with different directivities can also comprise lenses with different heights. Therein, a height is to be understood as a distance between an outermost surface of the lens and an active surface of the electrical component which is assigned to the lens. For example, this distance can be measured along an optical axis vertically to the substrate and/or vertically to this active surface.

As an alternative or in addition to the embodiments described above, the at least two lenses with different directivities can also comprise lenses with different base areas. Therein, a base area is to be understood as the shape and/or the size of the lens in a cutting plane which is positioned in the plane of an active surface of the optoelectronic component which is assigned to the lens. This plane can coincide with a plane of the substrate or can also be arranged offset to this plane of the substrate.

As an alternative or in addition to one or more of the aforementioned possibilities, the at least two lenses with different directivities can also comprise lenses in which an optical axis of each lens is aligned in a different manner with an optical axis of each optoelectronic component. As has been described above, one lens each can be assigned to exactly one optoelectronic component or also a plurality of optoelectronic components. The lens can comprise an optical axis, and the assigned optoelectronic component can also comprise an optical axis. Therein, use can be made of a radially symmetric structure in which the optical axes of the lens and the assigned optoelectronic component coincide. It is, however, also possible to provide a different alignment, for example, an alignment in which the optical axes of the lens and the assigned optoelectronic components are offset from each other in parallel. As an alternative or in addition, the optical axis of the lens and the optical axis of the optoelectronic component can also be aligned with each other in a slanted manner. As a matter of principle, the directional characteristic of the group consisting of the lens and the assigned optoelectronic component can also be changed in these manners. In this manner, it is also possible to produce lenses which comprise different directivities. It is particularly preferred that the lens system comprises at least one lens in which an optical axis of the lens is arranged offset to an optical axis of a lens of the assigned optoelectronic component, for example offset in parallel.

As has been described above, the lens system can, in particular, be designed such that exactly one lens is assigned to the optoelectronic component. In particular, the plurality of optoelectronic components can comprise a matrix of optoelectronic components, wherein the matrix can, in particular, be designed one-dimensionally or two-dimensionally. Accordingly, the lens system can comprise a matrix of lenses which can, in particular, be designed one-dimensionally or two-dimensionally. Therein, the matrices of the lenses and the optoelectronic components can correspond to each other, with the result that one element of the matrix of the optoelectronic components is assigned to exactly one element of the matrix of the lenses. For example, this arrangement can be achived such that the lenses are arranged above the assigned optoelectronic components, with the result that light emitted from the optoelectronic components passes through the assigned lens and/or the light initially passes through the lens and is then absorbed by the optoelectronic component that is assigned to the respective lens. As has been described above, a lens system having at least two lenses with different directivities is, in this case, particularly to be understood such that the optoelectronic module comprises at least two groups each consisting of at least one lens and at least one assigned optoelectronic components, with the directivities of said groups differing from each other, for example, with regard to an opening angle and/or an emission angle of the respective directivities.

Altogether, the lens system can comprise a total directivity which is composed of the directivities of all lenses. This directivity can, for example, be registered if all optoelectronic components of the optoelectronic module are active at the same time and act as a unit. The total directivity can, in particular, be designed with a high homogeneity, for example with a higher homogeneity than the directivity of an identical optoelectronic module which does not comprise any lens system. This homogeneity can be registered in a variety of manners. For example, a central area of the optoelectronic components, for example of the one-dimensional or two-dimensional matrix of the optoelectronic components can be defined, which comprises 50% of the lens system and/or the matrix of the optoelectronic components in at least one dimension on the substrate. Therein, the optoelectronic module can be designed by means of the composed total directivity such that the directivity within this central area comprises a deviation from a mean value of the total directivity within the central area of no more than 20%. This deviation can, for example, be related to an electric field strength of irradiated and/or emitted electromagnetic waves. As an alternative or in addition, this homogeneity function can, for example, also be related to an intensity of the irradiated and/or emitted electromagnetic waves.

The homogeneity of the total directivity can be improved according to the invention in a variety of manners, as compared with traditional optoelectronic modules. For example, at least one lens can be provided at an edge of the lens system, said lens comprising an opening angle with regard to its directivity that is smaller than at least one lens arranged in the interior region of the lens system. In particular, this opening angle can be 80% or less of the opening angle of the at least one lens arranged in the interior region of the lens system, i.e. be reduced to the 0.8-fold or less, as compared with the opening angle of the at least one lens arranged in the interior region of the lens system. Most preferably, this opening angle can be 60% or less of the opening angle of the at least one lens arranged in the interior region of the lens system, i.e. be reduced to the 0.6-fold or less, as compared with the opening angle of the at least one lens arranged in the interior region of the lens system. This condition can refer to a single lens arranged at an edge of the lens system or to a plurality of lenses arranged at the edge of the lens system. As has been described above, it is also possible to change the opening angle of the directivity in a stepwise or stepless manner. In an optoelectronic module having one or more optoelectronic components in the form of light-emitting diodes, the opening angle can, for example, refer to an emission angle.

In an LED, the opening angle or emission angle can, for example, be defined as the angle at which the radiation density is still 50% of the maximum radiation density at an angle of 0° in relation to the optical axis. Typically, an LED is designed as a Lambertian emitter. In general, a Lambertian emitter typically comprises an emission angle of approx. 60°. In this case, the above factor of at least 0.8 results in 0.8×60°=48° and therefore already to a significant restriction of the opening angle which, here, can, for example, also be referred to a collimation angle. As far as LEDs are concerned, emission angles down to 5° are, typically, still conceivable in case of strong collimation, wherein a typically reasonable range for collimating applications is within a range from 10° to 30°. If output efficiencies are high in the interior region of the arrays, typical angles range from 30° to 60° or more.

As an alternative or in addition, it is also possible to provide at least one lens at an edge of the lens system, said lens comprising an opening angle of its directivity that is in excess of the at least one lens arranged in the interior region of the lens system. For example, the opening angle of this lens may be 120% of the opening angle of the inner lens or more, i.e. it is increased to a factor of 1.2 or more. Most preferably, the opening angle of this lens may be 140% of the opening angle of the inner lens or more, i.e. it is increased to a factor of 1.4 or more. As a matter of principle, however, other embodiments are also possible. Again, this condition can refer to one or more lenses arranged at an edge of the lens system wherein, as a matter of principle, it is, for example, also possible to change the opening angle in a stepless and/or stepwise manner.

As a matter of principle, the lenses can comprise one or more curved surfaces. In particular, at least one lens of the lens system can comprise a surface curvature with at least one convex area and at least one concave area. For example, the concave area can be surrounded by the convex area in an annular manner. As has been described above, a convex area is, therein, to be understood as an area having a converging effect with regard to the optical axis of the lens, whereas a concave area is to be understood as an area which comprises a scattering effect with regard to light which exits the lens. The convex and concave areas can be arranged, in particular, on a side of the lens system facing away from the substrate, particularly when the optoelectronic components are in direct contact with a material of the lens system or are, for example, embedded in the lens system as a whole or in part.

In particular, the optoelectronic module can be designed without edge, at least approximately. In particular, a minimum distance between the optoelectronic components and an edge of the substrate and/or between the lens system and an edge of the substrate can be less than 10 mm, preferably less than 5 mm and most preferably less than 3 mm. Typical distances are less than 5 mm, for example range from 0.5 mm to 2 mm.

An optoelectronic device is suggested according to another aspect of the present invention. In general, an optoelectronic device is to be understood as a device which can execute at least one optoelectronic function, for example, a light emission function and/or a photodetection function. For example, the optoelectronic device can be provided as an illumination device, either as a whole or in part.

The optoelectronic device comprises at least two optoelectronic modules according to the present invention, i.e. for example in one or more of the embodiments described above and still described below. The substrates of the optoelectronic modules are arranged in the optoelectronic device such that they are neighboring each other, preferably spaced apart less than 10 mm, for example, spaced apart less then 1.0 mm.

For example, the substrates of the optoelectronic modules can be arranged such that they are at least approximately parallel to each other, for example with an angular deviation of a parallel arrangement of less than 10°, preferably of less than 5°.

However, applications in which the substrates can be aligned with each other in a non-parallel arrangement are also conceivable. Within the scope of the present invention, the device can, for example, also be implemented such that the substrates of the optoelectronic modules are aligned with each other in a slanted manner, for example, to achieve a targeted three-dimensional illumination of a solid angle range. In this regard, reference can, for example, be made to the post-published patent application, DE 10 2010 013 286, from the house of the application of the present application. With the appropriate modification according to the invention, the arrangements and devices presented there can also be implemented within the scope of the present invention. It is, for example, possible to implement an optoelectronic device which comprises a plurality of optoelectronic modules according to the invention, more particularly optoelectronic chip-on-board modules which are arranged such that they are neighboring each other at least in pairs or spaced apart from each other at a predetermined distance, wherein each optoelectronic module comprises a plurality of LEDs, for example, at least one LED array each, wherein, with regard to their face normal, for example the face normal of their substrates, at least one pair of neighboring optoelectronic modules is arranged at an angle that is in excess of 0°, for example in excess of 5°, for example in excess of 10°, for example in excess of 15°, for example in excess of 20°, for example in excess of 30°. As will still be explained in more detail below, the substrates can, for example, be arranged on lateral faces of a fictitious or real cylindrical body which may comprise a polyhedral base surface. Therein, the outer faces or also the inner faces of the substrates can be fitted with the optoelectronic components. For example, the angle between the face normals of neighboring substrates can be 45° in a cylinder having an octagonal base surface and 60° in a cylinder having a hexagonal base surface. The angle can be designed rigidly, for example, by fixing the optoelectronic modules in position to each other, but it can also be designed variably, for example, adjustably.

For example, the modules of the optoelectronic device can produce a longitudinally extending illumination device that has an irregular or regular polygonal cross-section along its longitudinal extension at least over sections thereof, or is arranged to achieve a regular or irregular polyhedral shape, more particularly a Platonic or Archimedean body. In particular, the optoelectronic device can form an illumination device having a flexible shape.

The optoelectronic device, for example the illumination device, comprising the optoelectronic modules that are slanted in relation to each other, can, for example, be designed such that the LEDs of the optoelectronic modules are facing outwards or are pointing into a hollow space of the device.

Due to the arrangement of a plurality of optoelectronic modules that are slanted in relation to each other, for example at angles of the face normals of more than 10° to each other, it is, for example, possible to selectively implement three-dimensional forms and/or it is possible to selectively influence an array overlap. This can, in particular, be achieved by forming the optical system in a position-dependent manner, in order to be able to achieve targeted array distributions even in three-dimensional forms. For example, two or more optoelectronic modules and/or their substrates in a device according to the invention can be arranged on cylindrical surfaces or can form cylindrical surfaces, wherein the cylinders can, for example, comprise a hexagonal or octagonal base surface. It is, for example, possible to achieve homogeneous array distributions around an axis of the cylinder that are at least approximately circular.

In particular, the substrates of the optoelectronic modules can be arranged such that component sides of the substrates of the optoelectronic modules point to the same direction. If the substrates are aligned with each other in a non-parallel manner, as has been described above, the component sides of the optoelectronic modules can, however, also point to different directions, for example in order to achieve a targeted three-dimensional illumination.

According to another aspect of the present invention, a method is suggested for manufacturing an optoelectronic module according to the invention, i.e., an optoelectronic module, for example according to one or more of the embodiments described above or still described below. As a matter of principle, it is, for example, possible to utilize known methods for manufacturing the optoelectronic module, for example, the known prior-art methods described above. In particular, the methods described in DE 10 2010 044 470 and/or in DE 10 2010 044 471 can be utilized to manufacture an optoelectronic module according to the present invention or parts thereof. Within the scope of the present invention, full reference is accordingly made to these manufacturing methods. For example, use can be made of a method in which the substrate is initially pre-heated to a first temperature. Subsequently, at least one bank consisting of a first thermally hardening, highly reactive silicone that hardens at a first temperature can be applied onto the pre-heated substrate, wherein the bank encloses a surface or partial surface to be coated of the substrate, either as a whole or in part. Subsequently, the area or partial area of the substrate that is enclosed by the bank is completely or partially filled with a liquid second silicone, and the second silicone can be hardened. One, more or all lenses of the lens system can be manufactured by means of the first silicone and/or the second silicone. As regards further embodiments, reference can be made to DE 10 2010 044 470. As an alternative or in addition, the optoelectronic module and/or the lens system can be manufactured as a whole or in part according to the method described in DE 10 2010 044 471. For example, a liquid silicone can, in particular, be potted into a mould that is open at its top and, particularly in at least one mould cavity, comprises outside dimensions that correspond to the outside dimensions of the substrate or are in excess thereof. Furthermore, the substrate can be introduced into the mould, wherein at least one of the optoelectronic components or, preferably, all of the optoelectronic components are fully immersed into the silicone and one surface of the substrate is in full contact with the silicone, or the substrate immerses into the silicone at least with a part of its full surface. Furthermore, the silicone can be hardened and cross-linked with the optoelectronic components and the substrate. Furthermore, the substrate provided with the coating consisting of the hardened silicone can be removed from the mould. The mould can, in particular, be designed such that, by means of the mould, for example, at least one mould cavity of the mould the lens system comprising the at least two lenses is formed from the silicone.

In particular, a method can be utilized for manufacturing the optoelectronic module according to the present invention, said method being a method according to which the lens system is manufactured such that at least one formable starting material of the lens system, for example at least one silicone, can be brought into contact with the optoelectronic components and, preferably, with the substrate as well, and then molded and hardened. As regards potential embodiments of this method, reference can be made to the above description and, in particular, to the aforementioned prior art.

According to a further aspect of the present invention, a use of an optoelectronic module according to the invention, for example according to one or more of the embodiments described above or still described in more detail below, is suggested for an exposure application and/or an irradiation application. In particular, this application can be an application for irradiation using ultraviolet and/or infrared light. In this exposure application and/or irradiation application, at least one workpiece is exposed to electromagnetic beams emitted by the optoelectronic module, wherein the workpiece may be a starting material and/or a workpiece that has already been molded. These electromagnetic beams can, for example, comprise light in the ultraviolet and/or visible and/or infrared spectral range. Preferable, this irradiation can be used for the purpose of drying and/or hardening and/or for the purpose of a photochemical modification of the workpiece or parts thereof.

The suggested optoelectronic module, the suggested optoelectronic device, the method and the use provide a large number of advantages as compared to known devices, methods and uses of the aforementioned type. In particular, it is possible to implement an efficient and side-by-side mounting light source the lighting profile of which has a very high radiation intensity at an adjustable distance. According to the invention, it is, furthermore, possible to meet high homogeneity requirements and to optionally implement a sufficiently steep drop in the illumination in an edge region at the same time. In particular, uses can be implemented in the field of industrial production, for example, in a printing industry with lithographic applications, in order to reach a uniform and high-quality drying image of print colors and/or inks and/or photoresists. It is, in particular, possible to implement radiation intensities of more than 100 mW/cm$^2$, preferably of more than 1-20 W/cm$^2$, up to 100 W/cm$^2$, in order to reach high process velocities with light sources that are as compact and energy-efficient as possible. It is, in particular, possible to implement tailor-made optoelectronic modules and/or optoelectronic devices for specific applications.

It is, in particular, possible to design the optoelectronic module or the optoelectronic device as a light source of light-emitting diodes, either as a whole or in part. This light source of light-emitting diodes can be implemented based on LED arrays which, due to an optional almost edgeless cast optical system, can be mounted side by side and virtually without any gap, for example spaced apart less than 10 mm, in order to achieve a homogeneous array distribution. Therein, it is also possible to compensate larger distances of LED arrays from each other by using the above possibility for forming the optical system of the lens system in a position-dependent manner.

When mounted side by side, particularly the lighting currents of the individual LED arrays add up, particularly in the emission overlap area. In order to meet the homogeneity requirements even in the areas where the irradiations of two or more LED arrays overlap each other, the emission of an individual LED array should be adjusted accordingly, in particular in the edge region.

In order to meet the homogeneity requirements and, at the same time, reach a steeply dropping radiation intensity, for example, at the outer edge of a plurality of arrays, the lens forms of an array of the lens arrangement can be varied in their direction of side-by-side mounting. In particular, a steep drop in the radiation intensity can be required in an edge region in order to be able to design the lamp in the spatial direction in which the homogeneity requirement applies as small as possible.

The central lenses of a lens system can, for example, be designed in a rather scattering manner, i.e., for example with a greater opening angle, and the outer lenses can be configured in a rather collimating manner. Thereby, light from the centre of the array is, for example, generally allocated to the edge regions, and the radiation intensity can, thereby, drop more in the edge region. Furthermore, the radiation intensity in an area that corresponds to the LED lamp and is positioned in front of said lamp can be homogenized at a defined distance, wherein the range of the homogeneous area can be maximized.

As has been described above, these advantages can be implemented in a variety of manners within the scope of the invention. In particular, lenses can be provided which comprise areas with a convex curvature and with a concave curvature. For example, a convex curvature, particularly when the cross-section is viewed through a lens centre in one spatial direction, can end in an area that is concave in the lens centre. Depending on the configuration in this area, the lens can then rather be collimating or rather be scattering.

As an alternative or in addition, this effect can be intensified by varying the lens height of the individual lenses above the optoelectronic components, in particular the LEDs. In contrast thereto, there are known prior-art lenses that are usually provided with identical lenses, for example with a flat design of the lenses in the centre, as described particularly in U.S. Pat. No. 7,819,550 B2. In contrast to the prior art, it is therefore possible according to the invention to adequately meet homogeneity requirements and/or requirements for a steeply dropping edge region. The extra expenditures required by the embodiment according to the invention is kept within a justifiable limit because it is possible to modify the design only once, for example appropriate forms for the manufacture of the lens system, particularly in terms of the result that can be achieved with regard to an increase in energy efficiency and a compactness of the optoelectronic module and the optoelectronic device.

By configuring the lens system and the local dependence of the directivity of the lenses, further advantageous effects can be achieved. In particular, an additional steeper drop in the radiation intensity can be achieved in an edge region by making a targeted decentration between a lens and an assigned optoelectronic component, for example an assigned light-emitting diode. As an alternative or in addition, it is possible to achieve a decentration of a lens in relation to the LEDs in a side-by-side-mounting direction. For example, use can be made of an array of optoelectronic components and an array of lenses, wherein there are various possibilities that can be implemented with regard to the pitch of these arrays. For example, a homogeneous pitch of the array of the optoelectronic components can be combined with an inhomogeneous pitch of the lens array or vice versa. An inhomogeneous pitch of the array of the optoelectronic components with an inhomogeneous pitch of the lens array is also conceivable.

A plurality of optoelectronic modules in an optoelectronic device can be mounted side by side in one or also in two spatial directions. Furthermore, it is also possible to implement an asymmetric lens form. A lens size, in particular a base surface and/or a height of the lenses, can be varied within the lens system in a position-dependent manner. Over and above this, use can also made of the measures according to the invention, either separately or in combination, to achieve a targeted increase in a radiation intensity in specific areas of an area to be illuminated. Usually, this is, for example, associated with a flatter drop in an edge region of a lamp. A combination of the aforementioned measures can, in particular, result in a homogeneous distribution of a radiation intensity at an altogether high level of the available lighting current at an adjustable working distance.

By utilizing the measures according to the invention, either separately or in combination, use can furthermore be made of the advantages of the chip-on-board technology in order to achieve a high lighting current from a relatively small area of the optoelectronic module. It is, in particular, possible to achieve LED packing densities that are as high as possible and a good thermal management. In particular by means of the preferred embodiment of a potted optical system described above, the light can be efficiently used to generate the desired lighting profile at a specified distance, for example 2 mm to a few 10 cm above the optoelectronic module, for example the LED chip. For example, use can be made of distances of typically 5-200 mm, depending on the size of the optoelectronic module and/or the optoelectronic device. In general, use can, for example, be made of radiation intensities of more than 100 mW/cm$^2$, typically 1-20 W/cm$^2$, to typically 100 W/cm$^2$. At the same time, the lens system, in particular the potted optical system of the lens system, can also protect the optoelectronic components, for example the LEDs, against outside influences, such as dirt, moisture and mechanical impacts.

The effect of the individual lenses can be adjusted to the exact array position of the optoelectronic components, in particular the LEDs. This can, for example, be achieved by varying the lens form of the lenses and the lens position in relation to the optoelectronic components, for example the LEDs, or vice versa. As a result, a homogeneous radiation intensity can be achieved at a specific distance, irrespective of whether or not there is a neighboring array, and at the same time, a strictly defined edge region can be optionally achieved at outside arrays. Thereby, it is possible to efficiently achieve the targeted distribution of the radiation intensity at a specific distance. The steep edge drop can minimize the lamp length required and reduce the costs incurred, whereas a compactness can be increased at the same time. The possibility to mount individual arrays side by side to obtain the light source of light-emitting diodes can ensure a considerable freedom with regard to the overall size that can be implemented. The optoelectronic device can, in particular, have a modular structure. In a modular structure comprising a plurality of optoelectronic modules that are mounted side by side in a modular manner, an optoelectronic module and/or array can be replaced if, for example, this optoelectronic module or array is defective. This can considerably reduce the resulting costs caused by the replacement and simplify the service associated therewith.

The manipulation of the directivity, for example the manipulation of the distribution of the radiation intensity in front of an LED module, can be optimized in both spatial directions vertically to the normal of the emission surface, even separately. As a matter of principle, the described embodiments according to the invention allow achieving targeted array distributions, even in case of three-dimensional LED array arrangements, for example in case of LED arrays that are slanted in relation to each other.

If necessary, the aforementioned effect of a steep edge drop can also be converted vice versa and into its opposite. If the edge drop is deliberately kept flat, the available light can be distributed in a different manner. For example, a high radiation intensity can be generated centrally in front of the individual arrays in the stead of a radiation intensity that is homogeneous over the entire lamp length.

All in all, a modular system consisting of high-power LED arrays which can achieve a high efficiency during operation can be generated according to the invention, wherein said modular system can, in particular, be adjusted to different process geometries and process sequences. What is more, the good thermal management of the LED arrays and an efficient micro-optical system can ensure the freedom of configuring the LED light source based on water or air cooling, depending on requirements.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIGS. 2A-4B each show optoelectronic devices comprising a plurality of optoelectronic modules as well as associated directional characteristics;

FIG. 5 is a magnified view of an optoelectronic module according to the invention with a locally dependent directional characteristic; and FIGS. 6A-7B each again show optoelectronic devices comprising a plurality of optoelectronic modules and the associated directional characteristic.

DETAILED DESCRIPTION OF THE INVENTION

Figure 1:
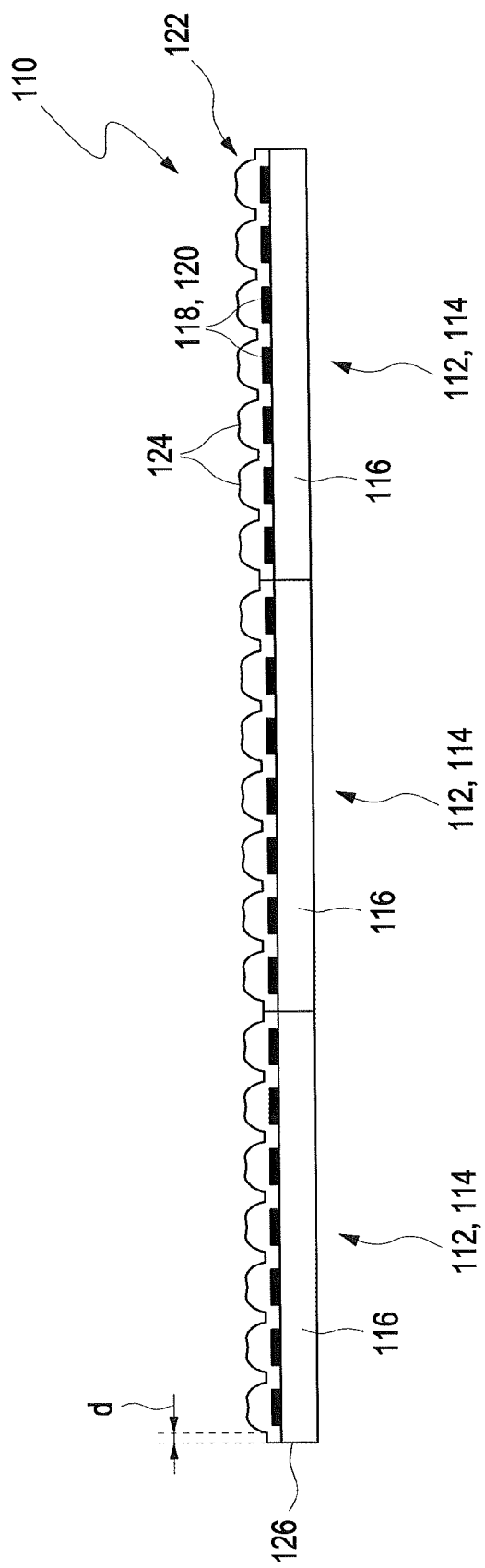
FIG. 1 is an exemplary embodiment of an optoelectronic device according to the invention, comprising a plurality of almost edgeless optoelectronic modules that are mounted side by side.

Identical or like elements and/or corresponding parts are identified in the following figures through the same reference numbers such that there is no need to introduce each again in each case.

The invention will, in particular, be illustrated without any limitation to further potential embodiments by means of chip-on-board modules, i.e. by means of luminous elements, as an example of optoelectronic modules and, in particular, of chip-on-board modules. Within the scope of the invention, it is also possible to use photodiodes in solar cells or other components as optoelectronic components in the stead of LED modules.

FIG. 1 shows a first exemplary embodiment of an optoelectronic device 110 according to the invention, said optoelectronic device 110 being composed of a plurality of optoelectronic modules 112—three in the illustrated instance—that are mounted side by side. The optoelectronic device 110 can, for example, be provided as an irradiation device. The optoelectronic modules 112 can, for example, each be designed as chip-on-board modules 114.

The optoelectronic modules 112 each comprise a substrate 116 which has a planar design at least in parts and onto which optoelectronic components 118, for example unhoused optoelectronic components 118, are applied, for example in chip-on-board technology. Without limiting further embodiments, it is assumed in the following that these optoelectronic components 118 are light-emitting diodes 120. The optoelectronic components 118 are arranged in an array on the substrate 116, this, for example, resulting in an array of light-emitting diodes.

Furthermore, the optoelectronic modules 112 each comprise at least one lens system 122, for example a microlens system, which is represented as an array of lenses 124, for example, microlenses in the illustrated exemplary embodiment. As will still be illustrated in more detail below, the lenses 124 comprise a locally dependent directivity, more particularly a locally dependent directional characteristic, with the result that there are lenses 124 within each of the optoelectronic modules 112, said lenses 124 comprising directivities that are deviating from each other, if necessary in cooperation with the associated optoelectronic component 118 or the assigned light-emitting diode 120.

The lens system 122 can, for example, be manufactured using a potting method. To achieve this, it is for example possible to use the methods described above. In particular, such potting methods or other methods can be utilized to achieve an almost edgeless embodiment of the optoelectronic modules 112, with the result that, for example, a distance d between an outermost lens 124 and an edge 126 of the substrate 116 is less than 10 mm, preferably less than 5 mm and most preferably less than 3 mm. The almost edgeless application of the potted optical system allows mounting the arrays of light-emitting diodes 120 side by side virtually without any gap.

As is shown in FIGS. 2A and 2B, the directivities of the individual optoelectronic components 118 on each optoelectronic module 112 each add up to a total directivity fo the optoelectronic module 112. Therein, FIG. 2A, which is analogous to FIG. 1 but is an inverted presentation, shows an optoelectronic device 110 comprising two optoelectronic modules 112. FIG. 2B shows total directivities of the individual optoelectronic components 118 of the optoelectronic modules 112, designated with 128 as reference symbol there. Reference symbol 130 designates the sum of these total directivitites 120 of the individual optoelectronic modules 112. Here, a measurement value of an electric field strength E at a predetermined distance from the optoelectronic device 110 is used as directivity, wherein a measurement is taken along a position coordinate x in parallel to a surface of the optoelectronic modules 112. As a matter of principle, it is, however, also possible to use a different type of directivity measurement, for example an angle-dependent measurement relative to an angular normal of the light-emitting surface of the optoelectronic device 110.

If LED arrays are mounted side by side as shown in FIG. 2A, their lighting currents add up. A spacing between the centre points of the individual optoelectronic modules 112 is generally referred to as pitch p. If the LED arrays are mounted side by side with a spacing between the LEDs that remains constant, i.e. if the LED arrays are mounted side by side such that the pitch is maintained, the resulting radiation intensity at a specific distance is therefore largely homogeneous.

In contrast thereto, FIGS. 3A and 3B show an embodiment in a view that is analogous to FIGS. 2A and 2B, in which the spacing D between the optoelectronic modules 112 is greater. In this case, the optoelectronic modules 112 are accordingly mounted side by side such that the pitch is not maintained. Accordingly, the resulting radiation intensity is not homogeneous in an area between the optoelectronic modules 112.

Furthermore, FIG. 3A figuratively shows directional characteristics of individual lenses 124 in cooperation with the associated optoelectronic components 118 or light-emitting diodes 120, which are designated with a and b. For example, these may be edge rays which extend along a line at which an electric field strength and/or an intensity have dropped to half the maximum value.

FIGS. 4A and 4B show the effect of a variation in the directivity of the lenses 124 in a view that is analogous to FIGS. 3A and 3B. Hence, a lens 124 is shown in an interior region of the lens array, said lens 124 comprising a directional characteristic a, if necessary in cooperation with the associated optoelectronic component 118 or light-emitting diode 120, whereas a lens 124 positioned at an edge of the lens system 122 of an optoelectronic module 112 comprises a directional characteristic b. For example, the directional characteristic a may comprise an emission angle α whereas the directional characteristic b comprises an emission angle β. These different directional characteristics a, b can, for example, be achieved by varying the lens form and/or the lens height and/or the alignment of the lens 124 with the associated optoelectronic component 118. For example, a variation of the lens form of the lenses 124 in a side-by-side-mounting direction can generate a radiation intensity that is as homogeneous as possible at a specific distance, even if side-by-side mounting is effected in a non-pitch-maintaining manner. By varying the directivities, the total directivity 130 according to FIG. 4B is therefore considerably more homogeneous in an area between the optoelectronic modules 112 than in the embodiment according to FIGS. 3A and 3B. For example, central lenses 124 of the lens arrays can be configured in a rather scattering manner, as shown in FIG. 4A, and lenses at an edge of the lens array can be configured in a rather collimating manner, as shown in FIG. 4A, due to the smaller emission angle β.

As has been described above, a variation in the directivities of the lenses 124 can be achieved in a variety of manners which can also be combined. For example, FIG. 5 shows an optoelectronic module in which the lenses 124 are decentered and/or otherwise offset in a targeted manner in relation to the assigned optoelectronic components 118, for example the light-emitting diodes 120. For example, optical axes 132, 133 can be defined for the optoelectronic components 118 or the assigned lenses 124. For example, an optical axis 132 can be defined as a straight line for each optoelectronic components 118, said straight line centrally extending through an active surface 136, for example an emission surface, of the optoelectronic components 118. For example, an optical axis 134 of the lens can be understood as an axis of symmetry of the lens 124 wherein, as a matter of principle, asymmetric configurations are, however, also possible. As is shown in FIG. 5, the optical axes 132, 134 of the components 118, 124 that are assigned to each other may be offset to each other in parallel. This parallel offset which is figuratively designated with δ in FIG. 5 can be designed in a position-dependent manner, as shown in FIG. 5. For example, an offset δ=0 may occur in a centre of the lens array, whereas an offset that is as large as possible may occur in an edge region of the lens array. This results in an asymmetric directivity in an edge region of the lens array, said asymmetric directivity being directed more to the centre of the lens system in the illustrated exemplary embodiment. As an alternative or in addition to a pure parallel offset of the optical axes 132, 134, there may also be an angular offset. Furthermore, FIG. 5 also shows that a height H of the lenses 124 can, alternatively or additionally, be varied; this also applies to a form of the lenses 124. By taking one, more or all of the measures mentioned, it is, for example, all in all possible to achieve an additional steeper edge drop in the total directivity 130 for an individual optoelectronic module 112 or a total optoelectronic device 110.

FIGS. 6A and 6B are a view that is, for example, analogous to FIGS. 2A and 2B and shows a section through an optoelectronic device 110 comprising three optoelectronic modules 112, for example each according to the embodiment of FIG. 5, and an associated total directivity 130 (FIG. 6B). As has been described above, the lens forms of the lenses 124 can, for example, be varied in a side-by-side-mounting direction (for example, direction X in FIG. 6B) and/or the lenses 124 can be decentered relative to the optoelectronic components 118 or light-emitting diodes 120 subject to their array position, and/or the lens height H can be varied subject to the array position. For example, this can result in a homogeneous distribution with a high radiation intensity at an adjustable working distance, as can be seen from FIG. 6B.

While, in the exemplary embodiment according to FIGS. 4A and 4B, a directivity with an opening angle β was selected at the lenses 124 in an edge region of the lens array that was smaller than in a central area, it is, as a matter of principle, also possible to alternatively or additionally implement other embodiments. For example, FIGS. 7A and 7B show an embodiment in which, by taking for example one, more or all of the aforementioned measures, lenses in an inner area of a lens array comprise a smaller emission angle β than lenses in an edge region (opening angle α). All in all, a flatter edge drop can, for example, be used to ensure an additionally increased radiation intensity at a predetermined, for example adjustable, working distance from the optoelectronic device 110.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

The invention claimed is:

1. An optoelectronic module comprising a substrate, wherein
the substrate has a planar top surface, furthermore comprising a plurality of chip-on-board optoelectronic components that are arranged on the planar top surface of the substrate, wherein the optoelectronic module furthermore comprises a lens system having a plurality of lenses, the chip-on-board optoelectronic components being in direct contact with a material of the lenses, the chip-on-board optoelectronic components being selected from the group consisting of light-emitting diodes and photodiodes, wherein the lens system comprises at least two lenses with different directivities, and wherein a height of each lens in the lens system varies depending on a position of the lens in the lens system, such that the heights of the lenses continually increase or continually decrease between lenses at an edge portion of the lens system and lenses in a central area of the lens system, and wherein at least one but not every lens of the lens system comprises a surface curvature with at least one convex area and at least one concave area.

2. The optoelectronic module according to claim 1, wherein the chip-on-board optoelectronic components are arranged on the substrate in a one-dimensional or two-dimensional array, more particularly in a line or in a two-dimensional matrix.

3. The optoelectronic module according to claim 1, wherein the at least two lenses with different directivities comprise lenses with different surface curvatures.

4. The optoelectronic module according to claim 1, wherein the at least two lenses with different directivities comprise lenses with different base surfaces.

5. The optoelectronic module according to claim 1, wherein the at least two lenses with different directivities also comprise lenses in which an optical axis of each lens is aligned in a different manner with an optical axis of each chip-on-board optoelectronic component.

6. The optoelectronic module according to claim 1, wherein the lens system comprises at least one lens in which an optical axis of the lens is arranged offset to an optical axis of an chip-on-board optoelectronic component assigned to the lens.

7. The optoelectronic module according to claim 1, wherein the lens system is designed such that exactly one lens is assigned to each chip-on-board optoelectronic component.

8. The optoelectronic module according to claim 1, wherein at least one lens provided at an edge of the lens system comprises an opening angle of the directivity that is smaller than at least one lens arranged in the interior region of the lens system.

9. The optoelectronic module according to claim 1, wherein at least one lens provided at an edge of the lens system comprises an opening angle of the directivity that is in excess of the at least one lens arranged in the interior region of the lens system.

10. The optoelectronic module according to claim 1, wherein the concave area is surrounded by the convex area in an annular manner.

11. An optoelectronic device, comprising at least two optoelectronic modules according to claim 1, wherein the substrates of the optoelectronic modules are arranged in the optoelectronic device such that they are neighboring each other.

12. A method for manufacturing an optoelectronic module according to claim 1, wherein the lens system is manufactured particularly using a casting method such that at least one formable starting material of the lens system can be brought into contact with the chip-on-board optoelectronic components and then molded and hardened.

13. A use of an optoelectronic module according to claim 1, for an exposure application and/or an irradiation application, wherein at least one workpiece is exposed to electromagnetic beams emitted by the optoelectronic module.

* * * * *